United States Patent [19]
Badger

[11] Patent Number: 5,748,046
[45] Date of Patent: May 5, 1998

[54] PHASE LOCKED LOOP WITH CONTROLLABLE RESPONSE TIME

[75] Inventor: David Mark Badger, Indianapolis, Ind.

[73] Assignee: Thomson Consumer Electronics, Inc., Indianapolis, Ind.

[21] Appl. No.: 882,129

[22] Filed: Jun. 25, 1997

Related U.S. Application Data

[63] Continuation of Ser. No. 798,669, Feb. 12, 1997, abandoned, which is a continuation of Ser. No. 579,783, Dec. 28, 1995, abandoned.

[51] Int. Cl.$^6$ ............................................. H03L 7/093
[52] U.S. Cl. ........................ 331/17; 331/25; 329/308; 375/376; 455/260
[58] Field of Search ........................ 331/17, 25; 329/306, 329/308; 375/376; 455/260

[56] References Cited

U.S. PATENT DOCUMENTS

| | | |
|---|---|---|
| 4,290,028 | 9/1981 | LeGrand .................... 331/17 |
| 4,670,888 | 6/1987 | Smith, III .................. 331/1 R |
| 4,801,896 | 1/1989 | Phillips et al. ............. 331/25 |
| 5,272,452 | 12/1993 | Adachi et al. ............. 331/17 |
| 5,389,899 | 2/1995 | Yahagi et al. ............. 331/10 |

FOREIGN PATENT DOCUMENTS

| | | |
|---|---|---|
| 0 376 847 A2 | 7/1990 | European Pat. Off. . |
| 0 664 617 A2 | 7/1995 | European Pat. Off. . |

OTHER PUBLICATIONS

Data Sheet "MB1507 Serial Input PLL Frequency Synthesizer" Fujitsu Limited, pp. 3–79 to 3–90, Mar. 1991.
"DSS II Product Functional Specification", Section 2.3.1 Functional Description DSS II Link Section, Thomson Consumer Electronics, Inc., Revision 4, pp. 1–4, Sep. 22, 1995.
Preliminary Specification, "2.5 GHz bi-directional 12C-BUS Controlled Synthezizer TSA5055T", Phillips Semiconductors, pp. 3489, 3492–3497, Nov. 1991.
Data Sheet, "2.0 GHz PLL Frequency Synthesizers Include On–Board 64/65 Prescalers, MC145200, MC145201", Motorola Inc., pp. 1–20, 1993.

*Primary Examiner*—Siegfried H. Grimm
*Attorney, Agent, or Firm*—Joseph S. Tripoli; Peter M. Emanuel; Kuniyuki Akiyama

[57] ABSTRACT

An arrangement for selectively controlling the response time of a type II phase locked loop (PLL), especially one which includes a phase detector and an amplifier of a feedback type of integrator within an IC, comprises a controllable filter stage coupled in cascade with the amplifier. The controllable filter stage includes a filter section and a switching arrangement for selectively bypassing the filter section in response to a mode-determining control signal. In the described embodiment, the PLL controls the frequency of a local oscillator of a tuner and the second filter section has an amplitude versus frequency response for increasing the response time of the PLL during a fine tuning mode so that a demodulator can continue to operate properly during the fine tuning mode.

21 Claims, 5 Drawing Sheets

PHASE LOCKED LOOP WITH CONTROLLABLE RESPONSE TIME

This is a continuation of application Ser. No. 08/798,669 filed Feb. 12, 1997, now abandoned, which was a continuation of Ser. No. 08/579,783 filed Dec. 28, 1995, now abandoned.

FIELD OF THE INVENTION

The invention concerns a phase locked loop (PLL) with a controllable filter for electively controlling the response time of the PLL.

BACKGROUND OF THE INVENTION

Phase locked loops (PLLs) are used in a variety of applications for "locking" the frequency and/or phase of a controllable oscillator to that of a reference signal. For example, PLLs are commonly employed in tuners of communications equipment, such as radio and television receivers, to control the frequency of a local oscillator.

A phase locked loop includes a controllable oscillator for generating a controlled oscillator signal, a stable oscillator, such as a crystal oscillator, for generating a reference signal, and a phase detector for generating an error signal representing the phase and frequency relationships between the controlled oscillator signal and the reference signal. The error signal contains pulses which have either a relative positive polarity or a relatively negative polarity depending on the sense of the phase and frequency differences between the input signals of the phase detector and a variable duration which depends on the magnitude of the phase and frequency differences. The error signal is filtered by a filter, known as the "loop filter", to generate a control signal. The control signal is coupled to the controlled oscillator to control the frequency, and therefore the phase, of the controlled oscillator signal, in a feedback manner. As will be described below, depending on the type of PLL, either the frequency difference or both of the frequency and the phase differences will be minimized in response to the control signal. At that point, the PLL is said to be "locked".

In a tuner, the controlled oscillator is used as the local oscillator of the tuner, and a "programmable" frequency divider is coupled between the controlled oscillator and the phase detector. In this case, the error signal represents the phase and frequency differences between the frequency divided version of the local oscillator signal produced by the programmable frequency divider and the reference signal. When the PLL is locked, the frequency of the local oscillator signal generated by the controlled oscillator is proportional to the frequency of the reference signal by the programmable division factor (usually referred to as "N") of the programmable frequency divider. The use of a PLL in a tuner has several advantages. The frequency of the local oscillator is very stable since the frequency of the local oscillator is locked to that of the reference signal. In addition, the frequency of the local oscillator signal can readily be controlled, for example, to change channels, by digitally controlling the programmable division factor (N) of the programmable frequency divider.

As earlier noted, depending on the type of PLL, either the frequency difference or both of the frequency and the phase differences will be minimized in response to the oscillator control signal. In a "type I" PLL, the error signal is coupled to a simple low pass filter network. A type I PLL minimizes only the frequency difference between the input signals of the phase detector. In a "type II" PLL, the error signal is coupled to an integrator including an amplifier and a filter section arranged in a feedback configuration. A type II PLL minimizes both the frequency and the phase differences between the input signals of the phase detector due to the feedback loop of the integrator. A type II PLL is useful in applications in which both frequency stability and phase stability are desirable.

It is sometimes desirable to selectively change the response time of the PLL. In a type I PLL, this may readily be accomplished by selectively changing the loop filter in response to a control signal. For example, the MB1507 tuning control PLL integrated circuit (IC) includes an electronically controllable switch which may be turned "on" to bypass a first of two external low pass filter sections which are coupled in cascade between an error signal output of the IC and the control signal input of the local oscillator in order to decrease the time required to tune to a new channel.

SUMMARY OF THE INVENTION

However, the present inventor has recognized it is much more difficult to selectively change the response time of a type II PLL without changing the basic nature of the PLL or without significantly increasing the complexity of the PLL. A reason for this is that the filter network is included in the feedback path of the integrator, rather than directly in cascade with the output of the phase detector. Another reason is that a significant number of the components of the PLL, including the phase detector and the amplifier of the integrator, are usually included in a PLL IC and therefore not accessible for modification. These problems are exacerbated when it is desired to selectively increase rather than reduce the response time of the PLL.

With such difficulties in mind, the inventor has devised, in accordance with an aspect of the invention, an arrangement for selectively controlling the response time of a type II PLL arrangement, especially one which includes the phase detector and the amplifier of a feedback type of integrator within an IC. More specifically, an additional filter section is coupled in cascade with the amplifier of the integrator and a filter control section is coupled to the additional filter section for modifying the operation of the additional filter section in response to a mode determining control signal. In accordance with another aspect of the invention, the filter control section comprises a switching arrangement for selectively bypassing the additional filter section in response to the mode determining control signal. In accordance with still another aspect of the invention, the additional filter section has an amplitude versus frequency response for increasing the response time of PLL in response to the mode determining control signal.

These and other aspects of the invention will be described in detail with respect to the accompanying drawings.

BRIEF DESCRIPTION OF THE DRAWINGS

In the Drawings.

In the various Figures, the same or similar reference designations are used to identify the same or similar elements.

DETAILED DESCRIPTION OF THE DRAWING

The invention will be described with reference to a digital satellite television system in which television information is transmitted in encoded and compressed form in accordance with a predetermined digital compression standard, such as MPEG. MPEG is an international standard for the coded representation of moving picture and associated audio information developed by the Motion Pictures Expert Group. The DirecTv™ satellite television transmission system operated by the Hughes Corporation of California is such a digital satellite television transmission system.

In the transmitter, the television information is digitized, compressed and organized into a series or stream of data packets corresponding to respective video and audio portions of the television information. The digital data is modulated on to a RF carrier signal in what is known as QPSK (Quaternary Phase Shift Keying) modulation and the RF signal is transmitted to a satellite in earth orbit, from which it is retransmitted back to the earth. In QPSK modulation, the phases of two quadrature phase signals, I and Q, are controlled in response to the bits of respective digital data streams. For example, the phase is set to 0 degrees (°) in response to a low logic level ("0"), and the phase is set to 180° in response to a high logic level ("1"). The phase shift modulated I and Q signals are combined and the result transmitted as a QPSK modulated RF carrier signal. Accordingly, each cycle of the modulated QPSK carrier indicates one of four logic states, i.e., 00, 01, 10 and 10.

A satellite typically includes a number of transponders for receiving and retransmitting respective modulated RF carriers. In a conventional terrestrial television system, each RF carrier or "channel" contains information for only one television program at a time. Accordingly, to view a program, only the corresponding RF signal needs to be selected. In a digital satellite television system, each modulated RF carrier carries information for several programs simultaneously. Each program corresponds to groups of video and audio packets which are identified by a unique header appended to the packets which identifies the program. Accordingly, to view a program, both the corresponding RF signal and the corresponding packets need to be selected.

Figure 1:
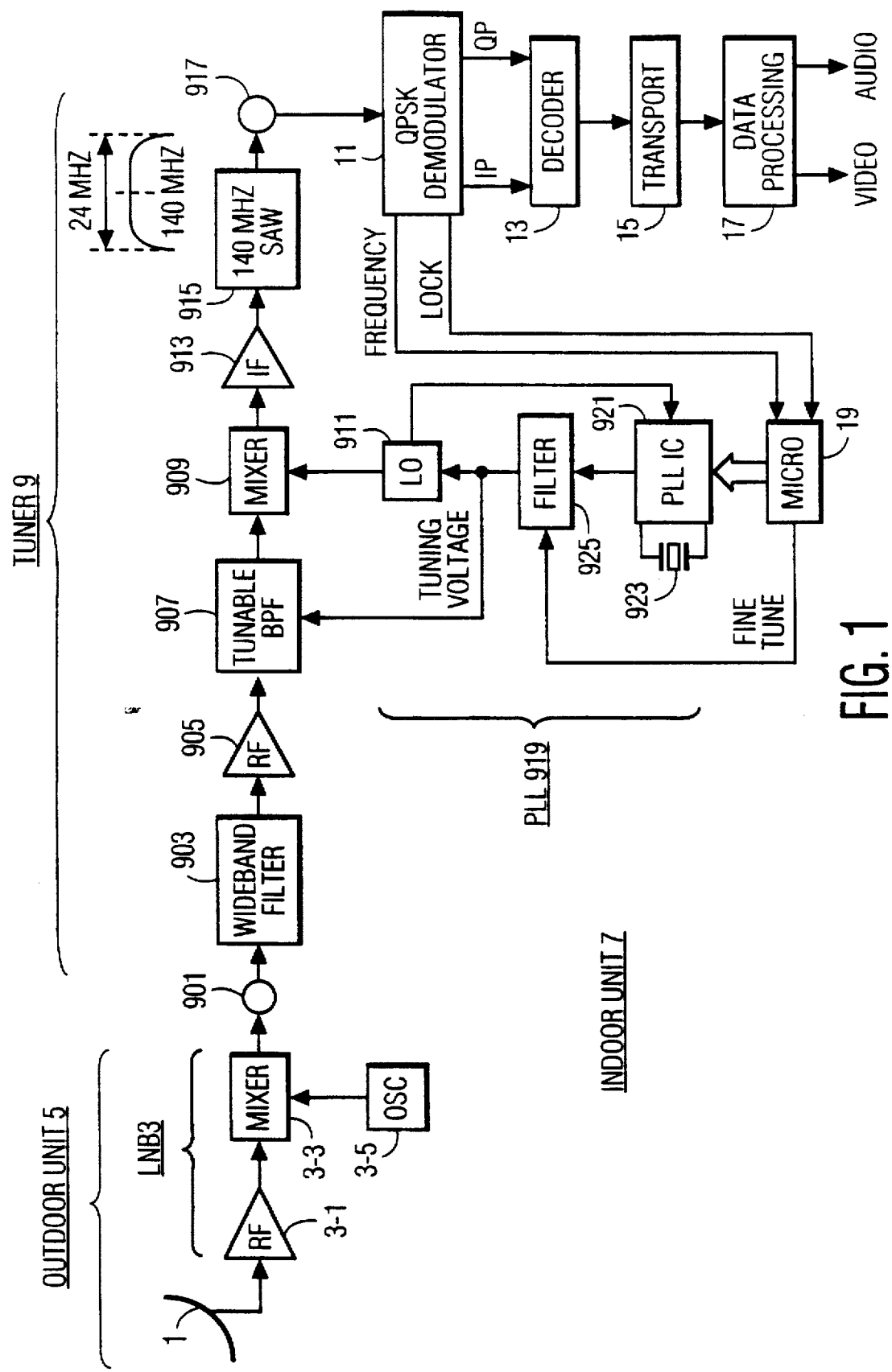
FIG. 1 is a block diagram of a digital satellite television receiver including a tuning system with reference to which a preferred embodiment of the invention will be described.

In the digital satellite television receiver shown in FIG. 1, RF signals modulated with digital signals representing video and audio information which have been transmitted by a satellite (not shown) are received by a dish-like antenna 1. The relatively high frequency received RF signals (e.g., in the Ku frequency range between 12.2 and 12.7 gHz) are converted by a block converter 3, including a RF amplifier 3-1, a mixer 3-3 and an oscillator 3-5, to relatively lower frequency RF signals (e.g., in the L band between 950 and 1450 mHz). Amplifier 3-1 is a "low noise" amplifier and therefore block converter 3 is often referred to by the initials "LNB" for "low noise block converter". Antenna 1 and LNB 3 are included in a so called "outdoor unit" 5 of the receiving system. The remaining portion of the receiver is included in a so called "indoor unit" 7.

Indoor unit 7 includes a tuning system 9 for selecting the RF signal which contains the packets for the desired program from the plurality of RF signals received from outdoor unit 5 and for converting the selected RF signal to a corresponding lower, intermediate frequency (IF) signal. An aspect of the present invention is concerned with the construction of tuning system 9 and will be described in detail below.

The remaining portion of indoor unit 7 demodulates, decodes and decompresses the digital information carried in QPSK modulation form by the IF signal to produce streams of digital video and audio samples corresponding to the desired program, and, thereafter, converts the digital sample streams to respective analog video and audio signals suitable for reproduction or recording. More specifically, a QPSK demodulator 11 demodulates the IF signal to produce two pulse signals IP and QP which contain respective streams of data bits corresponding to the data represented by the phase shift modulated I and Q signals generated in the transmitter. A decoder 13 organizes the bits of the IP and QP signals into data blocks, corrects transmission errors in the data blocks based on error codes which have been embedded in the transmitted data at the transmitter, and reproduces the transmitted MPEG video and audio packets. The video and audio packets are routed by a transport unit 15 to respective video and audio sections of a data processing unit 17 where they are decompressed and converted to respective analog signals. A microprocessor 19 controls the operation of various sections of indoor unit 7. However, only the control signals generated and received by microprocessor 19 necessary to describe an embodiment of invention are indicated in FIG. 1.

The digital satellite television receiver described so far is similar to the RCA™ type DSS™ digital satellite system television receiver commercially available from Thomson Consumer Electronics, Inc. of Indianapolis, Id.

As noted earlier an aspect of the present invention is concerned with the construction of tuning system 9. Tuning system 9 receives the RF signal provided by LNB 3 at an input 901. The RF input signals are filtered by a wideband filter 903, amplified by an RF amplifier 905, and filtered by a tunable bandpass filter 907. Tunable bandpass filter (BPF) 907 selects the desired RF signal and rejects unwanted RF signals. The resultant RF signal is coupled to a first input of a mixer 909. A local oscillator signal produced by a local oscillator (LO) 911 is coupled to a second input of mixer 909. The output of mixer 909 is amplified by an amplifier 913 and coupled to the input of an IF filter 915 comprising a SAW device. The output of IF filter 915 is coupled to output 917 of tuning system 9.

The frequency of LO 911 is controlled by a phase locked loop (PLL) arrangement 919 comprising a PLL integrated circuit (IC) 921, an external frequency reference crystal 923 and an external filter network 925. The frequency of the LO signal is controlled by PLL 919 in accordance with data generated by a microprocessor 19. Details of PLL 919 are shown in FIG. 2.

Figure 2:
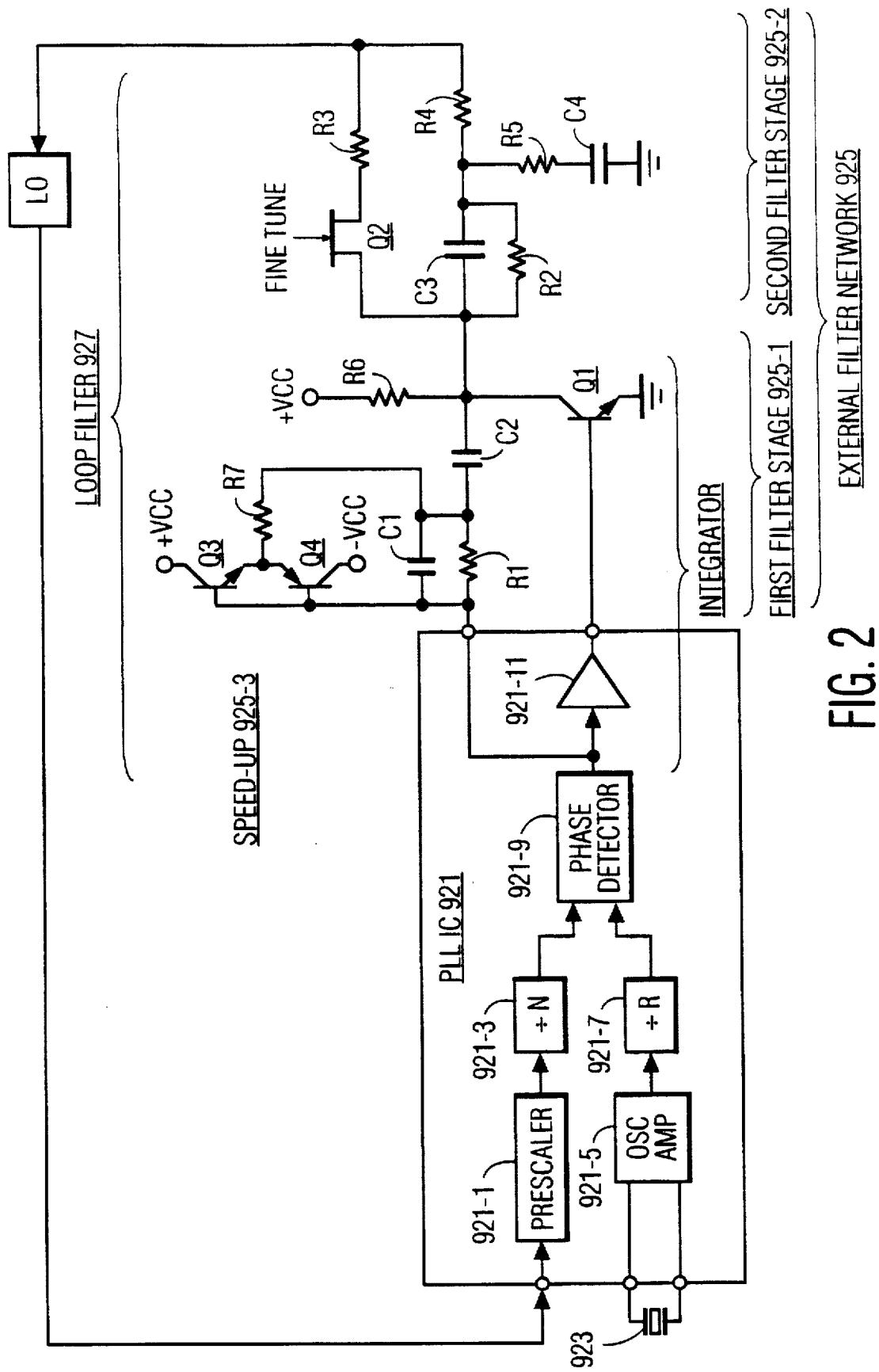
FIG. 2 includes a block diagram of a phase locked loop tuning control integrated circuit used in the tuning system shown in FIG. 1 and a schematic diagram of a circuit implementation of a controllable phase locked loop filter which is constructed in accordance with an aspect of the invention.

As is shown in FIG. 2, the PLL IC 921 includes a "prescalar" frequency divider 921-1 for dividing the frequency of the LO signal followed by a programmable frequency divider (÷N) 921-3. PLL IC 921 also includes an amplifier 921-5, which in combination with external crystal 923, comprises a reference frequency oscillator. The output of the reference frequency oscillator is coupled to the input of a reference frequency divider (÷R) 921-7. The output signals of programmable divider (÷N) 921-3 and reference divider (÷R) 921-7 are coupled to respective inputs of a phase detector 921-9. The output signal of phase detector 921-9 is an error signal which represents the frequency and phase differences between the frequency divided version of the LO signal produced at the output of programmable divider (÷N) 921-3 and the reference signal produced at the output of reference divider (÷R) 921-7. The error signal contains pulses which have either a relative positive polarity or a relatively negative polarity depending on the sense of the phase and frequency differences between the input signals of phase detector 921-9 and a variable duration which depends on the magnitude of the phase and frequency differences. The error signal is coupled to an amplifier 921-11, which together with external filter network 925, comprises a loop filter 927, for filtering the error signal to produce a tuning control voltage for LO 911. The tuning control voltage also controls tunable bandpass filter 907. Loop filter 927 is constructed in accordance with an aspect of the invention and will be described in detail below.

In operation, the frequency of the LO signal is controlled in response to the tuning voltage until the frequency and phase of the frequency divided version of the LO signal produced at the output of programmable divider (÷N) 921-3 are substantially equal to the frequency and phase of the reference signal produced at the output of reference divider (÷R) 921-7. At that point, the phase locked loop is "locked" and the frequency of the LO signal is proportionally related to the frequency of the reference frequency signal produced by reference frequency divider (÷R) 921-7 by the programmable division factor (N) of programmable divider (÷N) 921-3. Programmable division factor N is controlled in response to data generated by microprocessor 19 in order to control the LO frequency.

For cost reasons, it is desirable that tuning system 9 have the following three characteristics: (1) comprise only a single conversion stage prior to the IF filter stage; (2) provide an IF signal with a low enough frequency to allow a SAW device to be used for so called "digital symbol shaping", as well as normal IF filtering; and (3) be capable of being constructed utilizing a PLL tuning control IC conventionally used for broadcast and cable receivers. Basically, these goals are accomplished by: (1) selecting an IF center frequency to be in the order of the difference (e.g., 140 mHz) between the highest frequency of the RF signal received from the block converter (e.g., 1450 mHz) and highest local oscillator frequency (e.g., in the order of 1300 mHz) available by utilizing a conventional terrestrial broadcast and cable tuning control PLL IC; and (2) utilizing a local oscillator signal with a frequency range which is lower than, rather than higher than, the frequency range of the received RF signals. In the exemplary tuning system the center frequency of the IF signal is 140 mHz. However other IF frequencies are possible utilizing the guidelines set forth above.

A relatively low IF center frequency, e.g., in the order of 140 MHz, allows a single conversion tuner rather than a more expensive double conversion tuner to be used prior to the IF filter section. It also allows a SAW device which provides so called "digital symbol shaping", as well as normal IF filtering, to be used. In a digital transmission system, what is known as "digital symbol shaping" is performed in the transmitter to reduce inter-symbol interference due to transmission bandwidth limitations. It is also desirable to perform digital symbol shaping in the receiver to complement the digital symbol shaping performed in the transmitter.

Moreover, it is desirable that the IF filter provide for symbol shaping, as well as the normal IF filtering function, so that a separate digital filter not be required. By way of example, what is known in the digital filter arts as a "root raised cosine" response is suitable for digital symbol shaping. IF SAW filter 915 has such a response. The amplitude versus frequency characteristic of SAW filter 915 is shown in FIG. 1. It has a center frequency at 140 mHz and a relatively flat passband of about 24 mHz corresponding to the bandwidth of the received RF signals. A SAW filter with these characteristics utilizing a lithium tantalate substrate is described in detail in U.S. patent application Ser. No. 08/467,095 entitled "SAW Filter for a Tuner of a Digital Satellite Receiver", filed on Jun. 6, 1995 for K. J. Richter, M. A. Pugel and J. S. Stewart, and which is assigned to the same assignee as the present application.

In addition, with an IF center frequency of 140 mHz and a RF input frequency range between 950 and 1450 mHz, the LO frequency range is between 810 and 1310 mHz. The 810–1310 mHz frequency range of the LO signal permits PLL tuning control ICs which are conventionally and widely used for broadcast and cable receivers, and therefore relatively inexpensive, to be used rather than a PLL tuning control IC especially designed for satellite receivers. Such a broadcast and cable PLL tuning control IC is the TSA5515T commercially available form Philips Semiconductors of the Netherlands and others. The maximum LO frequency available using the TSA5515T and similar ICs is in the order of 1300 mHz, which is adequate.

The portion of tuning system 9 described so far is the subject matter of the above-noted US patent application Ser. No. 08/467,097 entitled "Tuner of a Digital Satellite Receiver" filed on Jun. 6, 1995 for M. A. Pugel and K. J. Richter, and which is also assigned to the same assignee as the present application. An aspect of the present invention is concerned with provisions for controlling LO 911 during acquisition and fine tuning operation, which will now be described.

Figure 3:
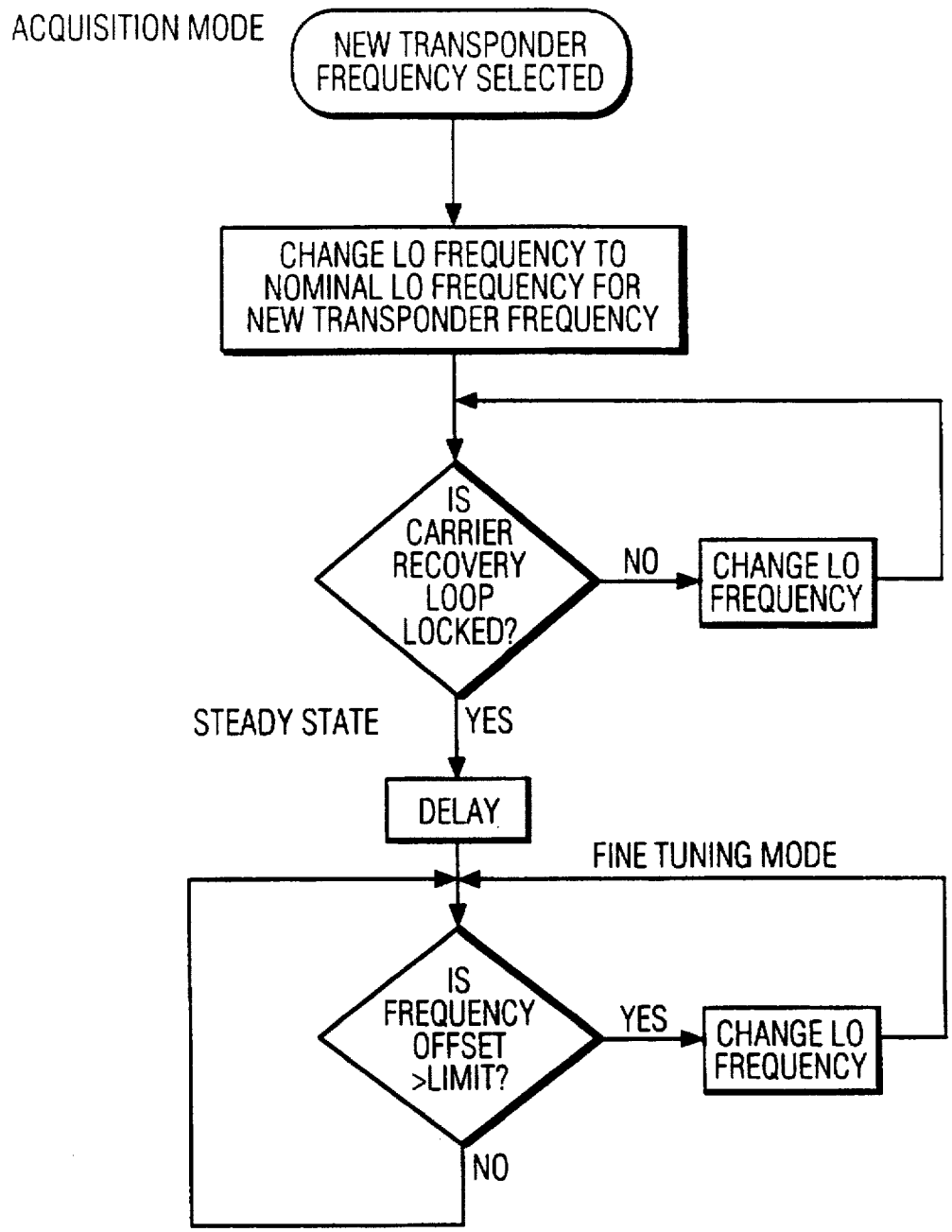
FIG. 3 is a flow chart of a microprocessor control program for the tuning system shown in FIG. 1.

The carriers of the RF signals transmitted by the satellite and received by antenna 1 have very stable frequencies which remain at "nominal" values. Therefore, as long as the frequency of oscillator 3-5 of LNB 3 is stable and remains at its nominal value, the frequencies of carriers of the RF signals received by tuning system 9 of indoor unit 7 will be at their nominal values. Unfortunately, the frequency of oscillator 3-5 can change with time and temperature. The frequency offset of the oscillator 3-5 with respect to its nominal frequency cause corresponding offsets of carrier frequencies of the RF signals received by tuning system 9. To compensate for these frequency offsets, the frequency of the LO 911 of tuning system 9 is changed under the control of microprocessor 19 in response to frequency status information received from the QPSK demodulator during two search operations. The flow chart of the control program of microprocessor 19 for tuning system 9, including the search operations, is shown in FIG. 3.

A first search may occur during an acquisition mode after a new program is initially selected. When a new program is selected, microprocessor 19 causes the LO frequency to be set to a nominal LO frequency corresponding to the nominal RF frequency of the transponder for the new program. Thereafter, the status of a LOCK signal generated by QPSK demodulator 11 is monitored. The LOCK signal indicates whether or not QPSK demodulator 11 is operating correctly to demodulate the digital data carried by the IF signal. For example, the LOCK signal has a low logic level when QPSK demodulator 11 is not properly demodulating the digital data, and the LOCK signal has a high logic level when QPSK demodulator 11 is properly demodulating the digital data. If the LOCK signal has the low logic level after the LO frequency has been set to the nominal LO frequency for the selected transponder, the frequency of LO 911 is changed to a range surrounding the nominal LO frequency until the LOCK signal has the high logic level. The generation of the LOCK signal indicates the beginning of a steady-state operating mode of tuning system 9.

During the steady-state mode, a FREQUENCY signal generated by QPSK demodulator 11 is monitored to determine whether or not the frequency of the carrier of the IF signal is centered within the passband of IF SAW filter 915, i.e., if the frequency of the carrier of the IF signal is at the nominal IF center frequency, e.g., 140 mHz in the present embodiment. The performance of the QPSK demodulator 11 will be degraded and data errors will occur if the frequency of the IF carrier falls outside of a predetermined range surrounding the nominal center frequency. If the FREQUENCY signal indicates that a predetermined frequency offset has not been exceeded, the frequency of LO 911 is left changed from the initial value established during the acquisition mode.

However, if the FREQUENCY signal indicates that a predetermined frequency offset has been exceeded, the frequency of LO 911 is changed during a second or "fine tuning" search operation until the situation is corrected. An aspect of the present invention is directed to solving a problem which may occur during the fine tuning mode, as will now be explained.

Tuning system 9, comprising terrestrial broadcast and cable PLL IC 921, has been found to perform very satisfactorily under most circumstances. However, terrestrial tuning PLL IC 921 has certain limitations which may result in the temporary loss of video and/or audio information. The size of the smallest frequency changes of a local oscillator controlled by a phase locked loop is related to the value of smallest possible increments of programmable division factor (N) of programmable divider (÷N) and to the frequency of the reference signal of PLL IC 921. Terrestrial tuning PLL ICs, such as the TSA5515T, are capable of changing the frequency of the LO signal only in relatively large incremental frequency steps, e.g., 62.5 kHz. As a result, during the two search operations, the frequency of the carrier of the IF signal will change in the same relatively large steps. Unfortunately, QPSK demodulator 11 may not be able to track such relatively large frequency steps thereby possibly causing an interruption of proper demodulation operation and a loss of video and audio data.

If a first search operation occurs during the acquisition mode, the loss of data is not noticeable because it is expected by a viewer that the acquisition process for a new program will take some time. However, should the second or fine tuning operation become necessary during the steady-state mode, the video and/or audio responses of the program presently be viewed may be interrupted. The possibility of such interruptions is reduced by reducing the "slew rate" of PLL arrangement 919, i.e., the rate at which the tuning voltage is allowed to change amplitude, during the fine tuning operation. More specifically, the response time of loop filter 927 is increased in response to a FINE TUNING control signal generated by microprocessor 19. The problem to which this solution is directed will now be described in greater detail with respect to FIG. 4, which shows a block diagram of an implementation of QPSK demodulator 11.

Figure 4:
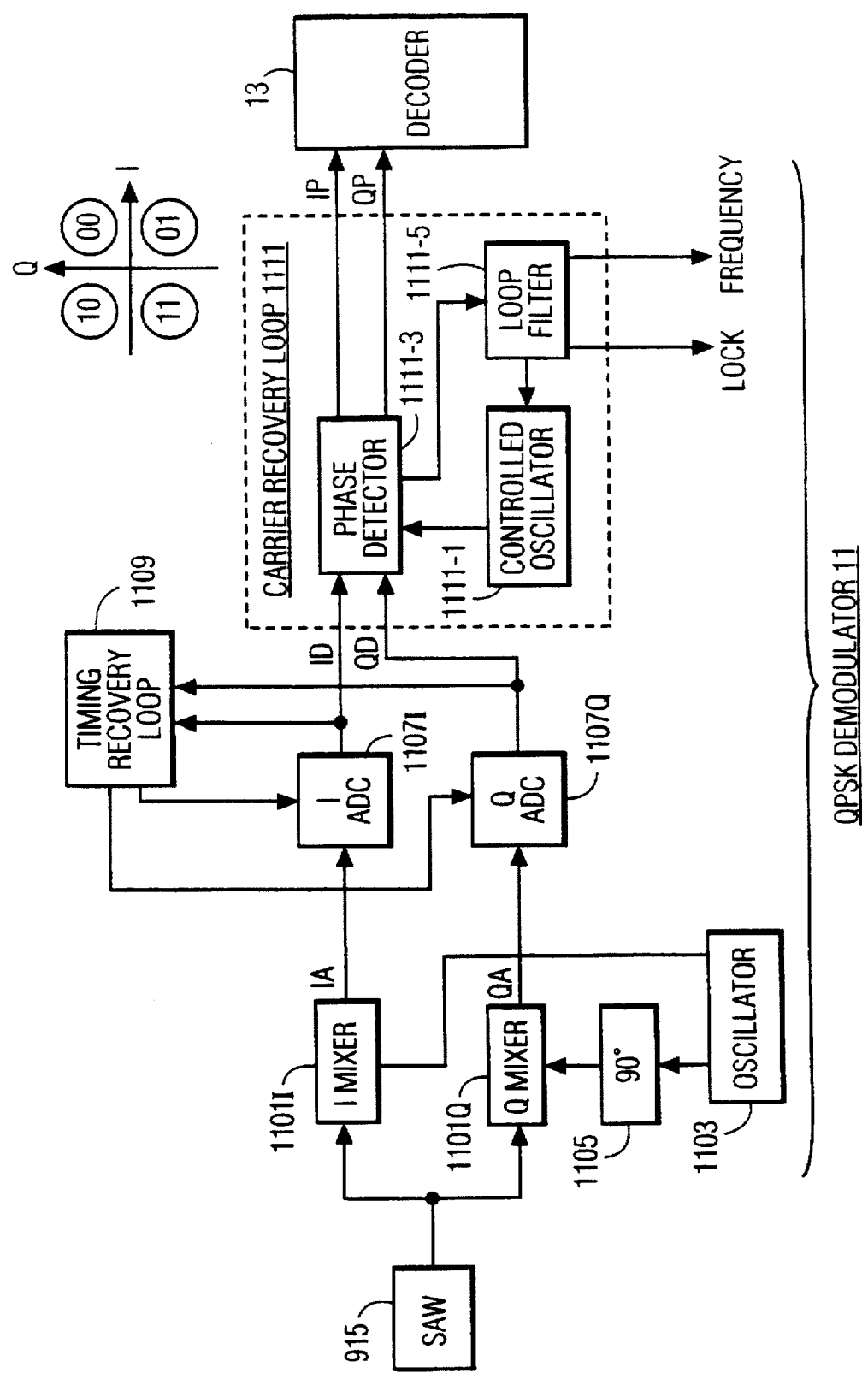
FIG. 4 is a block diagram of a digital data demodulator for use in the satellite receiver shown in FIG. 1 and useful in understanding a problem to which an aspect of the invention is directed.

As shown in FIG. 4, the IF signal produced by IF SAW filter 915 is coupled to respective first inputs of mixers 1101I and 1101Q. The letters "I" and "Q" signify "in-phase" and "quadrature". The output signal of a relatively stable frequency oscillator 1103 is directly coupled to mixer 1101I and indirectly coupled to mixer 1101Q via a 90 degree (90°) phase shift network 1105. Mixer 1101I produces an "in-phase", "near" baseband (much lower frequency) version (IA) of the IF signal, while mixer 1101Q produces a "quadrature", near baseband version (QA) of the IF signal, which is shifted 90 degrees with respect to the "in-phase" signal (IA). The letter "A" signifies "analog".

The IA and QA signals are coupled to respective analog-to-digital converters (ADCs) 1107I and 1107Q. Analog-to-digital converters 1107I and 1107Q also receive a clock signal from a "timing recovery loop" 1109 and produce respective series of digital samples ID and QD. The letter "D" signifies "digital". The frequency and phase of the clock signal determines the frequency of the digital samples and also the phase of the digital samples of the ID and QD digital signals relative to the IA and QA analog signals. Timing recovery loop 1109 includes a controlled oscillator (not shown) from which the clock signal for ADCs 1107I and 1107Q is derived. The controlled oscillator is controlled by a digital phase locked loop (not shown) so that the digital samples are synchronized with corresponding amplitude levels of the IA and QA analog signals, i.e., the maximum and minimum sample values correspond to the maximum and minimum amplitudes of the analog signals. In other words, timing recovery loop 1109 synchronizes the sampling operation of ADCs 1107I and 1107Q with the IF signal.

The ID and QD signals are also coupled to a "carrier recovery loop" 1111. Carrier recovery loop 1111 demodulates the phase shifts of the IA and QA analog signals represented by digital sample signals ID and QD so as to form respective pulse signals IP and QP. The letter "P" signifies "pulse". Each of the IP and QP pulse signals contain a series of pulses corresponding to data bits. The data bits have either a logic low ("0") level or logic high ("1") level corresponding to 0° and 180° phase shifts, respectively, of the I and Q signals of the transmitted QPSK RF carrier. The IP and IQ signal components are coupled to decoder 13, where the various data bits are formatted into MPEG data packets.

Carrier recovery loop 1111 includes a digital phase locked loop (PLL) comprising a controlled oscillator 1111-1, a phase detector 1111-3 and a loop filter 1111-5. Phase detector 1111-3 generates a phase error signal in response to the ID and QD signals and to the output signal of controlled oscillator 1111-1. The nominal frequency and nominal phase of the output signal of controlled oscillator 1111-1 correspond to the nominal frequency and nominal phase of the IF signal and therefore the nominal frequency and phases of IA and QA analog signals and the corresponding ID and QD digital sample signals.

In operation, the phase shifts of the signals represented by the ID and QD signals can be reliably determined from the phase error signal if the phase and frequency of the IF signal are correct. However, if the phase and frequency of the IA and QA are incorrect, the detected phase shifts will not be at 0° and 180°, but will instead be shifted from these values. In essence, a phase error causes a "tilt" of the "position" of two-bit demodulated data with respect to the ideal position of the two-bit data in a so called data "constellation". A frequency error, for example, due to a LNB derived frequency offset of the selected RF signal, causes a so called "rotation" of the position of the two-bit demodulated data of the QPSK signal with time. The direction of rotation is dependent on whether the frequency offset is positive or negative. As is shown in FIG. 4, the data constellation for QPSK modulation has four points corresponding to the four possible logic combinations (00, 01, 10 and 11) of the respective two possible logic levels represented by the two possible phase shift values of the I and Q signals. Phase detector 1111-3 measures the position of the demodulated data relative to the ideal position in the data constellation. To correct for data rotation and tilt, the frequency, and thus the phase, of the output signal of controlled oscillator 1111-1 is changed in response to the output signal of phase detector 1111-3 until the rotation stops and the tilt is eliminated. At this point, the demodulated data is reliable and the loop is said to be "locked". A high logic level LOCK signal is generated to indicate that the data is being reliably demodulated and can be decoded. The LOCK signal is generated by examining the derivative of the phase error signal to determine when the change in phase error falls below a predetermined limit. As noted above, during the acquisition mode, the LOCK signal is monitored by microprocessor 19 and the frequency of LO 911 is caused to be adjusted by microprocessor 19 until the LOCK signal has a high logic level.

Within limits, the carrier recovery loop 1111 can demodulate the QPSK data even when the frequency of the IF signal, and therefore the frequency of the IA and QA signals, is incorrect or offset. However, if the frequency offset is too great, a portion of the frequency spectrum of the IF signal will fall outside of the passband of SAW filter 915 due to the shift of the IF signal relative to the center frequency of SAW filter 915. This will cause a degradation of the signal to noise ratio of the receiver. Accordingly, as noted above, microprocessor 19 monitors a FREQUENCY signal generated by carrier recovery loop 1111 to indicate the frequency offset of the IF signal.

If the frequency offset exceeds a predetermined limit, microprocessor 19 causes the LO frequency to be adjusted to reduce the frequency offset during the fine tuning mode. The FREQUENCY signal is generated by integrating the phase error detected by phase detector 1111-3.

As noted above, the frequency of the LO signal, and therefore the frequency of the IF signal, changes in relatively large frequency steps, e.g. 62.5 kHz, and it may not be possible for QPSK demodulator 11 to track such relatively large frequency steps. As a result, an interruption of proper demodulation operation and a loss of video and audio data may occur. The ability of QPSK demodulator 11 to track the relatively large frequency changes is a function of the loop bandwidth of carrier recovery loop 1111, and more specifically the response of loop filter 1111-5. The loop bandwidth of carrier recovery loop 1111 should not be made arbitrarily large so as to decrease its response time because an increased loop bandwidth would degrade the signal to noise characteristics of the receiver and therefore the capability of the receiver to receive low level signals. It is also not desirable to decrease the loop bandwidth of PLL 919 so as to decrease its response time because a decreased response time would result in excessively long acquisition times when new transponder frequencies are selected. As noted above, to reduce possibility of the interruption of the demodulation process during the fine tuning operation, the response time of tuning control PLL 919 is selectively increased to reduce the rate at which the tuning voltage, and therefore the frequency of LO 911, is allowed to change during the fine tuning operation. This solution will now be described in detail.

Referring back to FIG. 2, and more particularly to the portion of the circuit labeled "LOOP FILTER 927". As described before, loop filter 927 includes amplifier 921-11 within PLL IC 921 and an external filter network 925. External filter network 925 includes a first filter stage 925-1 and a second, controllable filter stage 925-2 which are coupled in cascade between internal amplifier 921-11 and LO 911.

First filter stage 925-1 and amplifier 921-11 pf PLL IC 921 form an integrator. More specifically, first filter stage 925-1 includes a bipolar transistor Q1 arranged as a common-emitter amplifier. The base of transistor Q1 is connected to the output of amplifier 921-11 via an IC terminal. The emitter of transistor Q1 is connected to signal ground. A load resistor R6 is connected between the collector of transistor Q1 and a source of a supply voltage (+VCC). A filter section, including a resistor R1 and capacitors C1 and C2, is connected in a negative feedback path between the collector of transistor Q1 and the input of amplifier 921-11 via an IC terminal to complete the integrator. The feedback is negative due to the signal inversion provided by common-emitter configured transistor Q1.

The use of an integrator comprising amplifier 921-1 and first filter stage 925-1 connected in a negative feedback configuration makes PLL 919 a type II phase locked loop. A type II phase locked loop minimizes both the phase and frequency differences between the frequency divided version of the LO signal developed at the output of programmable frequency divider (+N) 921-3 and the reference frequency signal developed at the output of reference frequency divider (+R) 921-7, and therefore stabilizes both the phase and frequency of the LO 911.

Second filter stage 925-2 includes a two double-pole, double-zero filter section, including resistors R2, R4 and R5 and capacitors C3 and C4, and an electronically controlled switch section comprising field-effect transistor Q2 and relatively low value resistor R3. The conduction state of transistor Q2 is controlled in response to the FINE TUNE signal generated by microprocessor 19. Second filter section 925-2 is selectively controlled to either effectively by-pass the double-pole, double-zero filter section (R2, R4, R5, C3 and C4), or to include the double-pole, double-zero filter section in the path between first filter section 925-1 and LO 911. More specifically, when tuning system 9 is not in the fine tuning mode of operation, the FINE TUNE signal has a low logic level and the conduction channel of transistor Q2 is caused to be in the low impedance state, or "on". As a result, elements resistors R2, R4 and R5 and capacitors C3 and C4 of second filter section 925-2 are effectively by-passed due to "on" transistor Q2 and relatively low value resistor R3. In the fine tuning mode, the FINE TUNE signal has a high logic level and the conduction channel of transistor Q2 is caused to be in the high impedance state, or "off". As a result, resistors R2, R4 and R5 and capacitors C3 and C4 of second filter section 925-2 are connected in the path between first filter section 925-1 and LO 911.

Figure 5:
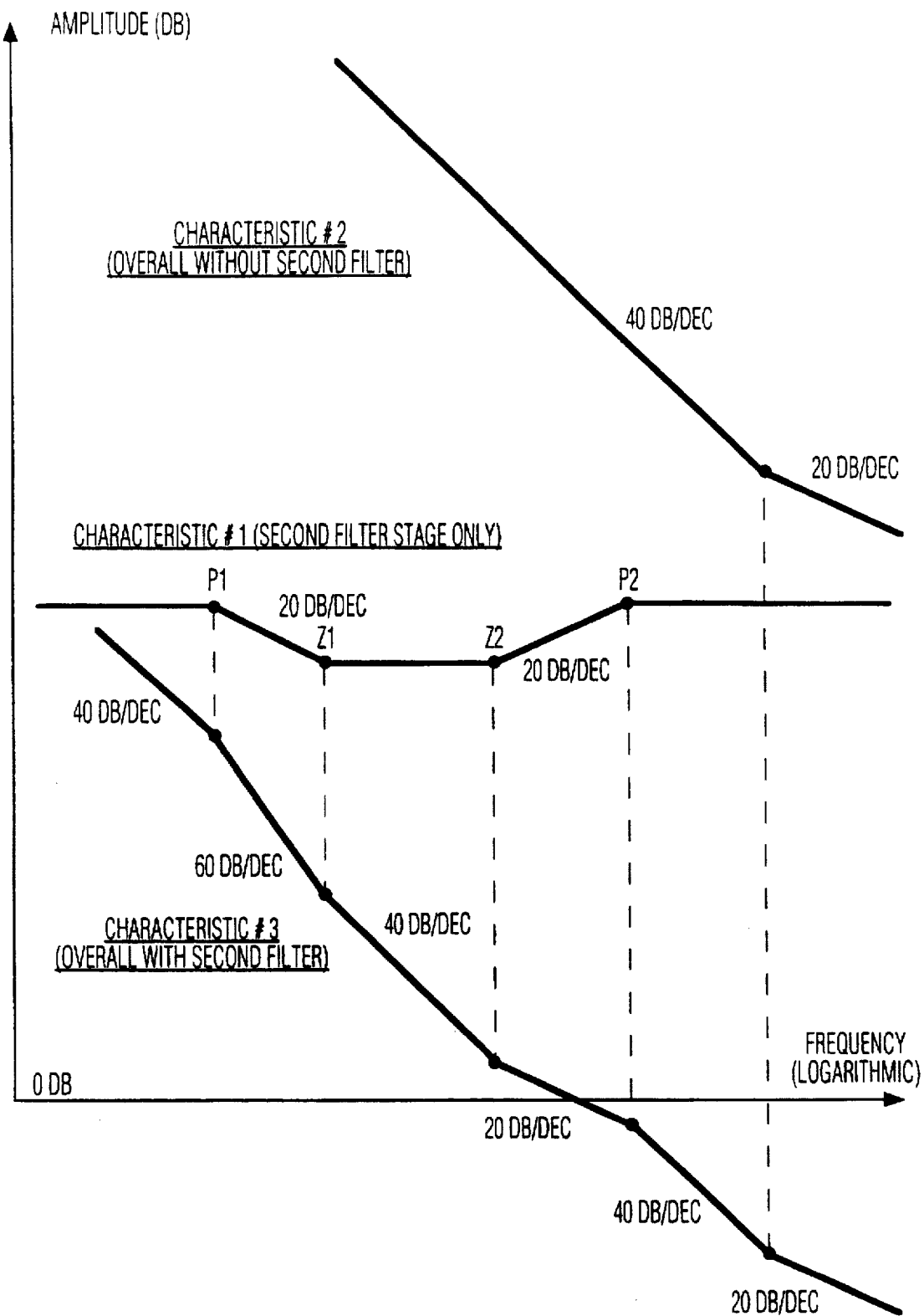
FIG. 5 shows graphical representations of amplitude versus frequency response characteristics associated with the controllable phase locked loop filter shown in FIG. 2 in accordance with an aspect of the invention.

The Bode amplitude versus frequency characteristic for double-zero filter section (R2, R4, R5, C3 and C4) of second filter stage 925-2 by itself is shown in FIG. 5 as characteristic #1. Amplitudes levels are indicated in decibels (dB) and the frequency axis is logarithmic. Characteristic #1 is seen to contain two "poles" P1 and P2 and two "zeros" Z1 and Z2, which occur in the order: pole P1, zero Z1, zero Z2 and pole P2 at successively higher frequencies. Pole P1 is due to resistor R2 and capacitor C4; zero Z1 is due to resistor R2 and capacitor C3; zero Z2 is due to resistor R5 and capacitor C4; and pole P2 is due to resistor R5 and capacitor C3.

Two Bode amplitude versus frequency characteristics of the overall loop response of PLL 919 are also shown in FIG. 5.

Characteristic #2 is the loop response when tuning system 9 is not in the fine tuning mode and loop filter 927 includes only first filter stage 925-1, i.e., the double-pole, double-zero filter section (R2, R4, R5, C3 and C4) of second filter stage 925-2 is by-passed. Characteristic #3 is the loop response when tuning system 9 is in the fine tuning mode and loop filter 927 includes first filter stage 925-1 and the double-pole, double-zero filter section (R2, R4, R5, C3 and C4) of second filter stage 925-2 coupled in cascade. Characteristic #2 has not been drawn to scale in terms of amplitude with respect to characteristics #1 and #2 to avoid an overlap of the characteristics.

Recalling that the overall amplitude versus frequency characteristic of two stages connected in cascade is the multiplicative product of the two individual characteristics, or the additive product when amplitudes are expressed in decibel (dB) levels, characteristic #3 results from the additive combination of characteristics #1 and 2. A pole of characteristic #1 causes an increase of the slope (in the negative direction) of characteristic #3. A zero of characteristic #1 causes a decrease of the slope (in the negative direction) of characteristic #3. Pole P1 reduces the overall loop gain and thereby the overall loop bandwidth. Without zeros Z1 and Z2, the slope of characteristic #3 would cross the 0 dB amplitude level with a slope of greater than 20 dB per decade of frequency, causing the loop to be unstable and thereby subject to oscillations. Pole P2 occurs incidentally due to the circuit topology requiring resistor R5 and capacitor C3. Nevertheless, pole P2 is advantageous in that it reduces the loop gain (i.e., increases the attenuation) for out-of-band signals such as the reference frequency signal of PLL 919.

It is seen in FIG. 5 that when tuning system 9 is not in the fine tuning mode (characteristic #2) the loop bandwidth is relatively large and therefore the response of PLL 919 is relatively fast. In contrast, when tuning system 9 is in the fine tuning mode (characteristic #3) the loop bandwidth is relatively small and therefore the response of PLL 919 is relatively slow.

In the implementation of second filter stage 925-2 shown in FIG. 2, resistor R4 is desirable to isolate the output of first filter stage 925-1 (at the collector of transistor Q1) from capacitor C4 for the following reasons. Capacitor C4 has a relatively large capacitance. Without resistor R4 (i.e., if resistor R4 were replaced by a direct connection), the series connection of capacitor C4 and resistor R5 would be directly connected in shunt with the output of first filter stage 925-1 when the tuning system is in the acquisition mode and switching transistor is "on". This would tend to undesirably increase the acquisition time. However, relatively high value resistor R4 isolates the output of first filter stage 925-1 from capacitor C4 and thereby inhibits capacitor C4 from significantly increasing the acquisition time.

Further in regard to relatively high valued capacitor C4, it may be desirable to provide for a predetermined time delay before allowing the fine tuning operation to begin after the acquisition mode to allow capacitor C4 to charge (or discharge) to the tuning voltage generated during the acquisition operation. Such a delay can be provided by microprocessor 19 under program control, as is indicated in the flow chart shown in FIG. 3.

It may be desirable to add a dynamic "speed-up" circuit 925-3 to first filter stage 925-1 as is shown in FIG. 2 to change the response time of PLL 919 so as to speed up the acquisition operation. Speed-up circuit 925-3 includes push-pull configured opposite conductivity type bi-polar transistors Q3 and Q4 and a resistor R7. The commonly connected bases of transistors Q3 and Q4 are connected to one side of capacitor C1 and the commonly connected emitters are connected via resistor R7 to the other side of capacitor C1. The collectors of transistors Q3 and Q4 are connected to respective sources of opposite polarity supply voltages +VCC and −VCC.

Exemplary component values for external filter network 925 are indicated in the following table.

| Component | Value |
| --- | --- |
| resistor R1 | 24 K (kilohms) |
| capacitor C1 | 4700 pf (picofarads) |
| capacitor C2 | 0.1 µf (microfarads) |
| resistor R6 | 2 K |
| resistor R7 | 10 K |
| resistor R2 | 1 M (megaohms) |
| capacitor C3 | 0.27 µf |
| resistor R3 | 2 K |
| resistor R4 | 20 K |
| resistor R5 | 470 ohms |
| capacitor C5 | 220 µf |

In operation, when a large frequency change occurs, such as when a new transponder frequency is selected, a large error signal is generated and a corresponding large voltage is developed across resistor R1. Depending on the polarity of the change, one of transistors Q3 or Q4 turns "on" and "sources" or "sinks" current. This causes an effective increase in the loop gain (i.e., characteristic #2 is shifted upward) and a consequential decrease in acquisition time. As PLL 919 nears the desired frequency and the error signal decreases, the "on" transistor is turned "off". A speed-up circuit similar to speed-up circuit 925-3, as well as other speed-up circuits, are described in detail in U.S. patent application Ser. No. 08/504,849, entitled "Fast Acting Control System", filed on Jul. 20, 1995 for David M. Badger, and assigned to the same assignee as the present application.

While the invention has been described by way of example in terms of a specific embodiment for a particular application, it will be appreciated by those skilled in the art that modifications may be made to suit other applications. In this regard, the invention may be employed whenever it is desired to change the response time of a closed loop arrangement employing a negative feedback type of integrator in which a filter section is included in the feedback path of an amplifier. Further in this regard while, the invention has been described with respect to an application requiring an increase of the loop response time, the invention may be employed to decrease the response time of a loop. In addition, while the invention has been described in terms of a specific circuit topology, the invention is applicable when other topologies are employed. For example, while the negative feedback of the integrator arrangement shown in FIG. 2 is due the signal inversion provided by common-emitter configured transistor Q1, negative feedback may be provided in other ways. By way of example, common-emitter configured transistor Q1 could be eliminated if amplifier 921-11 were an inverting amplifier. In addition, if an amplifier having both non-inverting and inverting inputs were employed instead of single-input amplifier 921-11, the negative feedback could be provided by coupling the filter section including resistor R1 and capacitors C1 and C2 to the inverting input, and common-emitter configured transistor Q1 could be eliminated. These and other modifications are intended to be within the scope of the invention defined by the following claims.

I claim:

1. Apparatus, comprising:

a closed loop arrangement including a controlled oscillator for generating a controlled oscillator signal having a frequency controlled in response to an oscillator control signal, a source of a signal representing a reference frequency, means for generating an error signal representing the phase and frequency relationship between said controlled oscillator signal and said signal representing said reference frequency, and a loop filter for filtering said error signal to generate said oscillator control signal; and means for generating a mode indicating control signal for controlling the mode of operation of said closed loop arrangement;

said loop filter of said closed loop arrangement including an amplifier and a first filter section coupled in a negative feedback configuration to form an integrator, a second filter section coupled in cascade with said integrator, and a filter control section coupled to said second filter section for modifying the operation of said second filter section in response to said mode indicating control signal.

2. The apparatus recited in claim 1, wherein:

said filter control section comprises a switching arrangement for selectively bypassing said second filter section in response to said mode indicating control signal.

3. The apparatus recited in claim 2, wherein:

said second filter section has an amplitude versus frequency response characteristic for increasing the response time of said closed loop arrangement while maintaining the stability of said closed loop arrangement.

4. The apparatus recited in claim 3, wherein:

said amplitude versus frequency response characteristic includes a pole, a first zero, and a second zero at successively higher frequencies.

5. The apparatus recited in claim 3, wherein:

said amplitude versus frequency response characteristic includes a first pole, a first zero, a second zero and a second pole at successively higher frequencies.

6. The apparatus recited in claim 3, wherein:

said second filter section includes a first capacitor and a first resistor coupled in parallel, the parallel combination being coupled in a serial relationship with the signal path between said means for generating said error signal and said controlled oscillator; and a second resistor and a second capacitor coupled in series, the series combination being coupled in a shunt relationship with said signal path between said means for generating said error signal and said controlled oscillator.

7. The apparatus recited in claim 1, wherein:

said closed loop arrangement comprises a phase locked loop integrated circuit including said means for generating said error signal and said amplifier of said loop filter.

8. The apparatus recited in claim 7, wherein:

said integrator and said second filter section of said loop filter are coupled in cascade in the order named between said means for generating said error signal and said controlled oscillator.

9. Apparatus, comprising:

a RF input for receiving a plurality of RF carrier signals;

a phase locked loop including a local oscillator for generating a local oscillator signal having a frequency controlled in response to a tuning control signal, means for dividing the frequency of said local oscillator signal by a programmable division factor to produce a frequency divided version of said local oscillator signal, a source of a reference frequency signal, means for generating an error signal representing the phase and frequency differences between said frequency divided local oscillator signal and said reference frequency signal, and a loop filter for filtering said error signal to generate said tuning control signal;

a mixer coupled to said RF input and to said local oscillator for producing an IF signal;

means for controlling the operation of said phase locked loop in a plurality of operating modes; said controlling means generating a control signal indicative of which one of said modes said phase locked loop is to operate in;

said loop filter of said phase locked loop including an amplifier and a first filter section coupled in a negative feedback configuration to form an integrator, a second filter section coupled in cascade with said integrator, and a filter control section coupled to said second filter section for modifying the operation of said second filter section in response to said mode indicating control signal.

10. The apparatus recited in claim 9, wherein:

said filter control section comprises a switching arrangement for selectively bypassing said second filter section in response to said mode indicating control signal.

11. The apparatus recited in claim 10, wherein:

said second filter section has an amplitude versus frequency response characteristic for increasing the response time of said phase locked loop while maintaining the stability of said phase locked loop.

12. The apparatus recited in claim 11, wherein:

said amplitude versus frequency response characteristic includes a pole, a first zero, and a second zero at successively higher frequencies.

13. The apparatus recited in claim 11, wherein:

said amplitude versus frequency response characteristic includes a first pole, a first zero, a second zero and a second pole at successively higher frequencies.

14. The apparatus recited in claim 11, wherein:

said second filter section includes a first capacitor and a first resistor coupled in parallel, the parallel combination being coupled in a serial relationship with the signal path between said means for generating said error signal and said local oscillator; and a second resistor and a second capacitor coupled in series, the series combination being coupled in a shunt relationship with said signal path between said means for generating said error signal and said local oscillator.

15. The apparatus recited in claim 9, wherein:

said phase locked loop comprises a phase locked loop tuning control integrated circuit including said means for dividing the frequency of said local oscillator signal, said means for generating said error signal and said amplifier of said loop filter.

16. The apparatus recited in claim 15, wherein:

said integrator and said second filter section of said loop filter are coupled in cascade in the order named between said means for generating said error signal and said local oscillator.

17. The apparatus recited in claim 9, wherein:

an IF filter having a center frequency is provided for filtering said IF signal; said IF signal having a nominal frequency corresponding to said center frequency of said IF filter;

means are provided for determining the deviation of the frequency of said IF signal from said nominal frequency; and said controlling means controls said phase locked loop to (1) establish an initial local oscillator frequency during an acquisition mode, and (2) change the local oscillator frequency from said initial local oscillator frequency to reduce a frequency deviation of said IF signal from said nominal IF frequency during a fine tuning mode;

said filter control section modifies the operation of said second filter section to increase the response time of said phase locked loop in response to said mode indicating control signal during said fine tuning mode.

18. Apparatus, comprising:

a phase locked loop arrangement including a controlled oscillator for generating a controlled oscillator signal having a frequency controlled in response to an oscillator control signal, a source of a signal representing a reference frequency, means for generating an error signal representing the phase and frequency relationship between said controlled oscillator signal and said signal representing said reference frequency, and a loop filter for filtering said error signal to generate said oscillator control signal; and means for generating a mode indicating control signal for controlling the mode of operation of said phase locked loop arrangement;

said phase locked loop arrangement comprising a phase locked loop integrated circuit including said means for generating said error signal and an amplifier;

said loop filter of said closed loop arrangement including said amplifier of said phase locked loop integrated circuit and a first filter section coupled in a negative feedback configuration to form an integrator, a second filter section coupled in cascade with said integrator, said integrator and said second filter section of said loop filter being coupled in cascade in the order named between said means for generating said error signal and said controlled oscillator, and a filter control section coupled to said second filter section for modifying the operation of said second filter section in response to said mode indicating control signal.

19. The apparatus recited in claim 18, wherein:

said filter control section comprises a switching arrangement for selectively bypassing said second filter section in response to said mode indicating control signal.

20. The apparatus recited in claim 19, wherein:

said second filter section increase the response time of said phase locked loop arrangement in response to said mode indicating control signal.

21. The apparatus recited in claim 20, wherein:

said second filter section decreases the loop gain of said phase locked loop arrangement while maintaining the stability of said phase locked loop arrangement.

\* \* \* \* \*